(12) United States Patent
Huffaker et al.

(10) Patent No.: US 7,432,175 B2
(45) Date of Patent: Oct. 7, 2008

(54) QUANTUM DOTS NUCLEATION LAYER OF LATTICE MISMATCHED EPITAXY

(76) Inventors: Diana L. Huffaker, 3315 Purdue NE., Albuquerque, NM (US) 87106; Larry R. Dawson, 8414 Hampton Ave. NE., Albuquerque, NM (US) 87122; Ganesh Balakrishnan, 133 Harvard SE., Albuquerque, NM (US) 87106

( * ) Notice: Subject to any disclaimer, the term of this patent is extended or adjusted under 35 U.S.C. 154(b) by 223 days.

(21) Appl. No.: 11/326,432

(22) Filed: Jan. 6, 2006

(65) Prior Publication Data
US 2008/0206966 A1    Aug. 28, 2008

Related U.S. Application Data

(60) Provisional application No. 60/641,784, filed on Jan. 7, 2005.

(51) Int. Cl.
H01L 21/20 (2006.01)
H01L 21/36 (2006.01)

(52) U.S. Cl. .............. 438/479; 438/962; 257/E29.071; 977/774

(58) Field of Classification Search ......... 438/479, 438/962; 257/E29.071
See application file for complete search history.

(56) References Cited

U.S. PATENT DOCUMENTS 5,614,435 A * 3/1997 Petroff et al. ............. 117/85
7,274,080 B1 * 9/2007 Parkin ..................... 257/421
2003/0170383 A1 * 9/2003 Eastham ................... 427/180

OTHER PUBLICATIONS

Balakrishan et al., "*Growth Mechanisms of Highly Mismatched AlSb on a Si Substrate*," Applied Physics Letters 86 034105 (2005), 3 pages.
Balakrishan et al., "*Room-Temperature Optically-Pumped InGaSb Quantum Well Lasers Monlithically Grown on Si(100) Substrate*," Electronics Letters, vol. 41, No. 9, Apr. 28, 2005, 2 pages.
Lee et al., "*Strain-Relieved, Dislocation-Free $In_xGa_{1-x}As/GaAs$(001) Heterostructure by Nanoscale-Patterned Growth*," Applied Physics Letters, vol. 85, No. 18, Nov. 1, 2004, pp. 4181-4183.

* cited by examiner

Primary Examiner—Walter Lindsay, Jr.
Assistant Examiner—Abdulfattah Mustapha
(74) Attorney, Agent, or Firm—MH2 Technology Law Group LLP

(57) ABSTRACT

Lattice mismatched epitaxy and methods for lattice mismatched epitaxy are provided. The method includes providing a growth substrate and forming a plurality of quantum dots, such as, for example, AlSb quantum dots, on the growth substrate. The method further includes forming a crystallographic nucleation layer by growth and coalescence of the plurality of quantum dots, wherein the nucleation layer is essentially free from vertically propagating defects. The method using quantum dots can be used to overcome the restraints of critical thickness in lattice mismatched epitaxy to allow effective integration of various existing substrate technologies with device technologies.

13 Claims, 3 Drawing Sheets

100

QUANTUM DOTS NUCLEATION LAYER OF LATTICE MISMATCHED EPITAXY

RELATED APPLICATIONS

This application claims priority from U.S. Provisional Patent Application Ser. No. 60/641,784, filed Jan. 7, 2005, which is hereby incorporated by reference in its entirety.

GOVERNMENT INTEREST

This invention was developed under Contract F49620-03-01-0433 between the University of New Mexico and the AFSOR, and Contract MDA972-00-1-0024 between the University of New Mexico and DARPA/Clemson. The U.S. Government may have certain rights to this invention.

FIELD OF THE INVENTION

The present invention relates to the growth of defect-free materials on dissimilar platforms and, more particularly, to the use of quantum dots to nucleate lattice-mismatched epitaxy.

BACKGROUND OF THE INVENTION

The growth of Group III-V materials on silicon (Si) has been pursued for two decades to facilitate the monolithic integration of light emitters with existing Si device technology. One problem has been the formation of a high density of dislocations due to the lattice mismatch between Si and Group III-V materials. Research efforts in the late 1980's demonstrated room-temperature GaAs/AlGaAs lasers and even vertical cavity lasers grown on Si (100). The device characteristics, however, were only marginal due to microcracks and a high dislocation density in the GaAs buffer.

Several growth methods were developed to improve the GaAs buffer, the two most notable of which were a low As/Ga ratio and in-situ thermal cycling. More recently, off-axis substrates and low-temperature growth techniques were invoked to nucleate GaAs growth on Si for InGaAs quantum dot (QD) based lasers. Problems arose, however, because the GaAs buffer was dominated by dark-line defects that originated at the GaAs/Si interface.

Thus, there is a need for lattice-mismatched epitaxy and methods for lattice-mismatched epitaxy that provide defect-free materials on dissimilar platforms.

SUMMARY OF THE INVENTION

In accordance with various embodiments, a method for forming a semiconductor device is provided. The method can include providing a substrate and forming a plurality of quantum dots on the substrate. The method can also include forming a nucleation layer by growth and coalescence of the plurality of quantum dots, wherein the nucleation layer has a threading dislocation density of less than about $5 \times 10^5$ cm$^{-1}$. A bulk layer can then be formed on the nucleation layer, wherein a mismatch between a lattice parameter of the substrate and a lattice parameter of the bulk layer is more than about 6%.

In accordance with various embodiments, a semiconductor device is provided. The semiconductor device can include a substrate and a nucleation layer disposed on the substrate and formed by coalescence of a plurality of quantum dots, wherein the nucleation layer has a threading dislocation density of less than about $5 \times 10^5$ cm$^{-1}$. The semiconductor device can further include a bulk layer disposed on the nucleation layer, wherein a mismatch between a lattice parameter of the substrate and a lattice parameter of the bulk layer more than about 6%.

In accordance with various embodiments, an optoelectronic device is provided. The optoelectronic device can include a lattice mismatched epitaxy comprising a substrate and a nucleation layer formed by coalescence of a plurality of quantum dots, wherein the nucleation layer has a threading dislocation density of less than about $5 \times 10^5$ cm$^{-1}$ and wherein the lattice mismatched epitaxy can further include a bulk layer disposed on the nucleation layer, wherein a mismatch between a lattice parameter of the substrate and a lattice parameter of the bulk layer is more than about 10%.

DESCRIPTION OF THE EMBODIMENTS

Reference will now be made in detail to exemplary embodiments of the invention, examples of which are illustrated in the accompanying drawings. Wherever possible, the same reference numbers will be used throughout the drawings to refer to the same or like parts.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

As used herein, the term "quantum dot" or "QD" refers to both tetragonally strained nanometer sized structures or "islands," as well as relaxed islands formed through an array of misfit dislocations at the growth interface.

Traditionally, quantum dots (QDs) have only been used as an active region material due to their unique three-dimensional confinement properties. According to various embodiments of the present teachings depicted in FIGS. 1-4B quantum dots, such as, for example, AlSb QDs can be used to overcome the constraints of critical thickness in lattice mismatched epitaxy. This can allow effective integration of various existing substrate technologies with device technologies including, but not limited to, light emitting diodes, detectors, thermophotovoltaic cells, solar cells, and high frequency transistors. By using a nucleation layer of AlSb on Si, for example, semiconductor lasers can be grown on Si. This can open up devices to Si processing technologies that can enable integration of an entire driving circuit on a single chip. Such integration can, for example, allow manufacturers to adopt extremely cost effective and profitable measures in the packaging of lasers and related devices.

Figure 1:
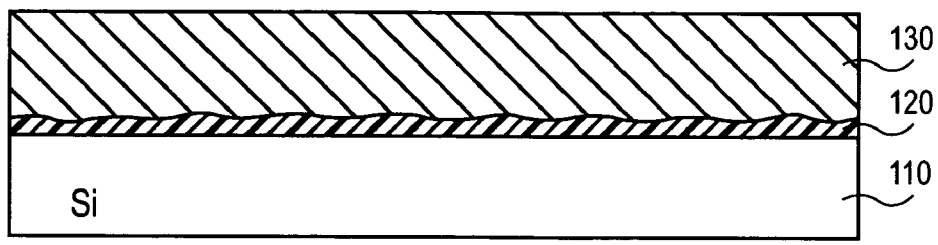
FIG. 1 depicts a cross section of a semiconductor device including a nucleation layer formed by coalescence and growth of quantum dots in accordance with exemplary embodiments of the present teachings.

Referring to FIG. 1, a semiconductor device 100 including a lattice mismatched epitaxy is schematically depicted. Semiconductor device 100 can include a first layer 110, a nucleation layer 120 disposed on first layer 110, and a second layer 130 disposed on nucleation layer 120.

First layer 110 can be a substrate or epitaxial layer formed of, for example, Si. In various other embodiments, first layer 110 can be GaAs or Ge. Nucleation layer 120 can be formed on first layer 110 and can comprise at least one element from Groups III-V. In various other embodiments, quantum dot layer 120 can comprise AlSb. Nucleation layer 120 can be formed by coalescence and growth of a plurality of quantum dots. The thickness of nucleation layer 120 can be about 3 to about 20 monolayers (ML). Nucleation layer 120 can further be essentially defect free having, for example, a threading dislocation density of less than about $5\times10^5$ $cm^{-1}$.

Second layer 130 can be disposed on nucleation layer 120 and formed by continued growth of nucleation layer 120. Second layer 130 can comprise, for example, AlSb. According to various embodiments, second layer 130 can be a bulk layer having undulations. The undulations can increase the surface area of second layer 130 and provide strain relief. Second layer 130 can further contain misfit dislocations, for example parallel to the (100) plane, however, these do not propagate vertically as threading or screw dislocations.

According to various other embodiments additional layers can be formed on the bulk layer, such as, for example, a GaSb layer on an AlSb bulk layer, and an InGaSb layer on the GaSb layer.

Figure 2A:
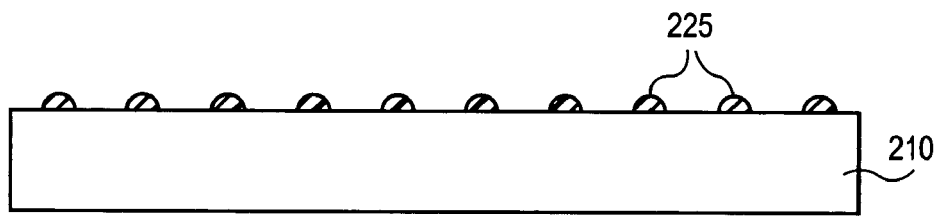
FIG. 2A depicts formation of a plurality of quantum dots on a substrate in accordance with exemplary embodiments of the present teachings.
Figure 2B:
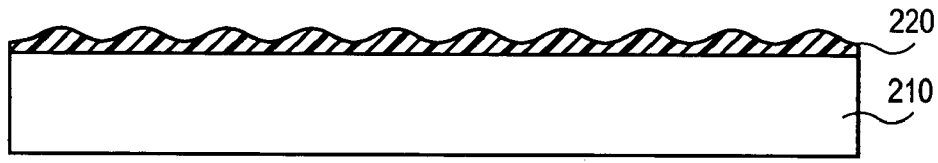
FIG. 2B depicts formation of a nucleation layer by coalescence and growth of the plurality of quantum dots in accordance with exemplary embodiments of the present teachings.
Figure 2C:
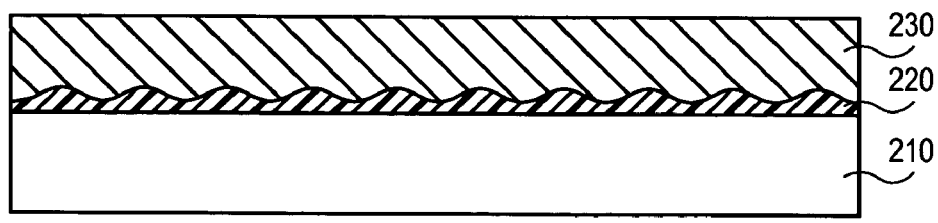
FIG. 2C depicts formation of a bulk layer over the nucleation layer in accordance with exemplary embodiments of the present teachings.

Exemplary methods for forming a lattice mismatched epitaxial layer/system will now be described. Referring to FIG. 2A, a substrate or first layer 210 comprising an epitaxial layer or a substrate can be provided. A plurality of QDs 225 can then be formed on first layer 210. Formation of QDs 225 can be by self-assembly via molecular beam epitaxy (MBE) or other epitaxy processes, such as, for example, chemical vapor deposition (CVD) techniques including metalorganic chemical vapor deposition (MOCVD). Each of the plurality of QDs can be about 3 mono layers (ML), but may be as thick as about 20 MLs depending on the lattice mismatch.

Nucleation layer 220 can then be formed on substrate 210 by continued growth and coalescence of QDs 225. According to various embodiments, about the first 20 MLs of nucleation layer 220 can be crystallographic to allow formation of a subsequent layer that is both almost completely relaxed and free from vertically propagating defects.

Second or bulk layer 230 can be formed on nucleation layer 220 by continued growth. In contrast to the coalescence of QDs 225 to form nucleation layer 220, formation of bulk layer 230 can be characterized by planar growth. While not intending to be bound by any particular theory, it is believed that nucleation layer 220 relieves most of the strain so that the relaxation is about 98% after about 3 ML. Relaxation can be determined by, for example, x-ray diffraction analysis.

Specific examples of a lattice mismatched epitaxyial layer/system and its method for formation will now be provided. It is to be understood that the disclosed examples are exemplary and are in no way intended to limit the scope of the invention.

EXAMPLE 1

A Si(100) substrate was rinsed in dilute hydrofluoric acid, followed by de-ionized water to remove surface oxide and passivate the Si surface with hydrogen atoms. The hydrogen atoms were removed by heating the substrate to about 500° C. in vacuum. A thermal cycle at 800° C. was used to ensure that any remnant of the oxide was removed. The removal of the hydrogen was then verified by reflection high energy electron diffraction (RHEED). The substrate temperature was reduced and stabilized at about 500° C. followed by a five minute soak in an Sb over pressure.

A plurality of AlSb quantum dots were then formed by self-assembly on the Si substrate using MBE. The AlSb quantum dots were grown at a substrate temperature of about 500° C., at a growth rate of 0.3 ML/sec., and using a Al:Sb ratio of about 1:10. After about 3 ML of deposition, the QD density was about $10^{11}$ QD/$cm^2$. QD height was about 1-3 nm and QD diameter was about 20 nm.

Continued deposition to about 18 ML caused the individual QDs to coalesce but remain crystallographic. Atomic force microscopy showed a crystallographic preference of the coalescence along the [110] direction. Continued deposition to about 54 ML showed continued coalescence towards planar growth.

Figure 3A:
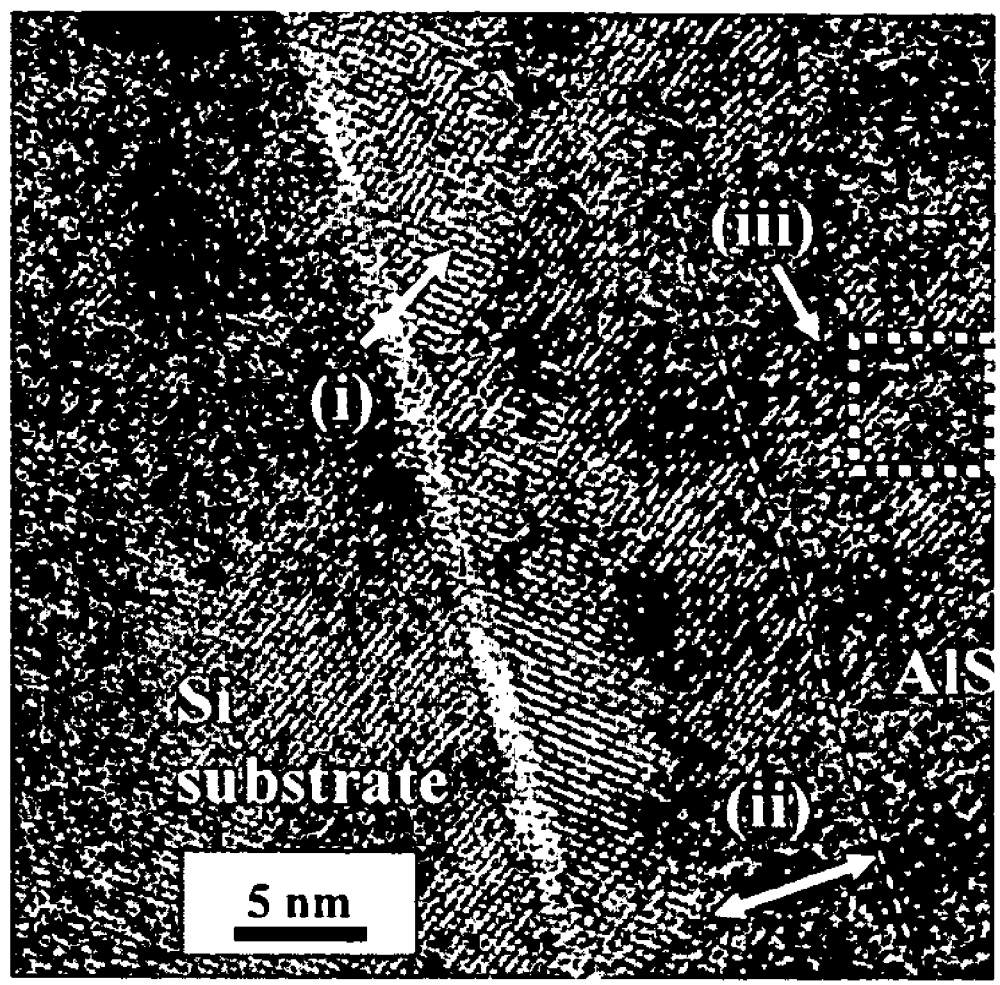
FIG. 3A shows a cross-sectional HR-TEM image of a (110) crystal plane at an AlSb/Si interface in accordance with exemplary embodiments of the present teachings.
Figure 3B:
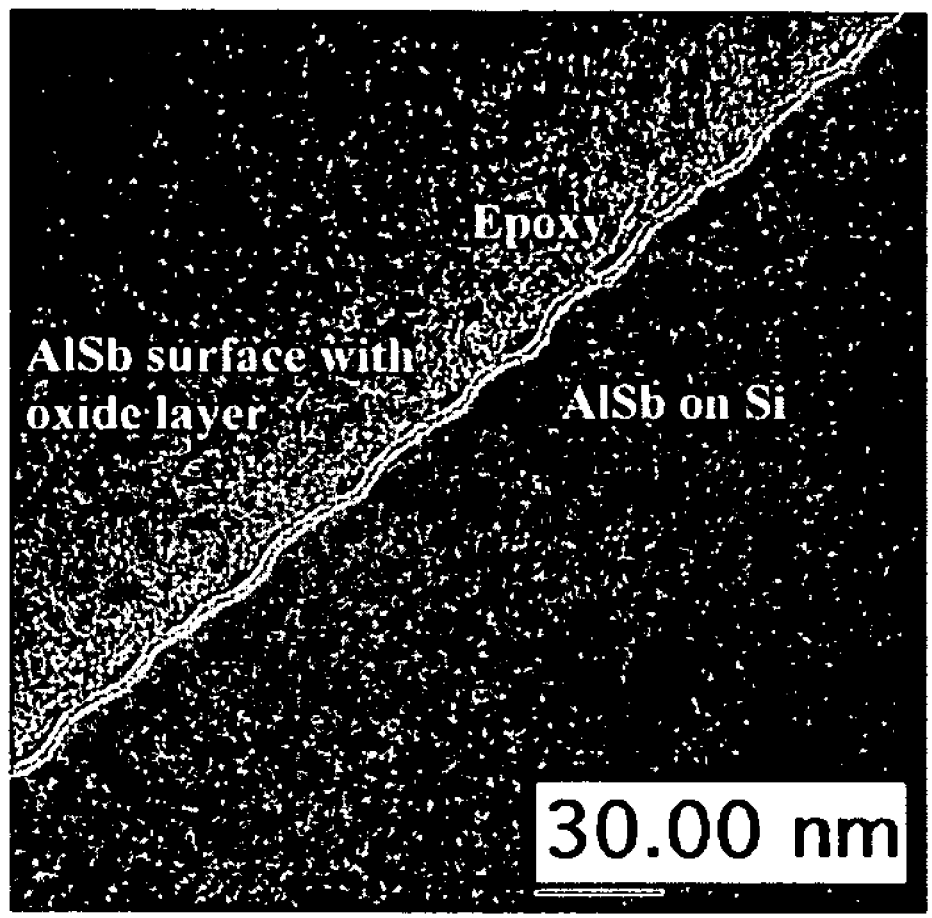
FIG. 3B shows a TEM image of the undulations of an AlSb surface after 70 mono layers of AlSb growth on Si in accordance with exemplary embodiments of the present teachings.

FIGS. 3A-B show a cross-section high resolution transmission electron microscope (HR-TEM) image of the (110) crystal plane at the AlSb/Si interface. The image shows three distinct regions labeled (i), (ii) and (iii). Region (i) refers to the white line along the interface that is an artifact of the initial AlSb nucleation on Si. The white appearance in contrast to the surrounding material indicates a higher density of atoms compared to the surrounding (110) plane, possibly due to a twisted lattice. Region (ii), about 5 ML in thickness, represents the nucleation layer formed by QD growth and coalescence. This material was defect free and showed a planar, homogeneous zinc-blend crystal structure in which the arrangement of the atoms was in the form of consecutive (100) planes. In contrast, region (iii) contained undulating bulk material denoted by a measurable rotation of the zinc blend crystal lattice. Region (iii) had a clockwise rotation of the lattice of about 8° with respect to the [111] direction. The crystallographic undulations or bending led to misfit dislocations that propagated parallel to the substrate. In other material systems, such as growth of InAs on GaAs, misfit dislocations can lead to vertical propagating defects, such as threading or screw dislocations. However, the AlSb did not propagate these vertical defects due to the strong Al—Sb bond at these growth temperatures.

After about 70 ML of AlSb growth on Si, the surface undulations were about 10 nm wide and about 1 nm high. This is shown in the cross sectional HR-TEM image of FIG. 3B. The misfit dislocation density was about $10^{10}/cm^2$ at this point in the growth process. With continued growth (~1 μm), the surface undulations merged, became shallower and considerably broader until they were no longer be detected by TEM. Analysis by HR-XRD using a combination of (004) and (115) scans of the AlSb layer (500 nm) grown on Si indicated the relaxation of the AlSb to be ~98%.

EXAMPLE 2

The exemplary lattice mismatched epitaxy can be used in the formation of optoelectronic devices, such as, for example, semiconductor lasers, light emitting diodes (LEDs), detectors, thermophotovoltaic cells (TVP), solar cells, and high frequency transistors on Si. For example, in another exemplary embodiment, a room-temperature optically-pumped InGaSb quantum well laser was grown on Si(100) substrate.

The Si(100) substrate was first hydrogen passivated in an HF etch, as above. The hydrogen was removed by heating the substrate to about 500° C. in vacuum followed by heating to 800° C. to ensure removal of oxide. The substrate temperature was then stabilized to about 500° C. After a five minute soak in an Sb overpressure, the structure was grown. The structure comprised a 100 Å AlSb nucleation layer and an AlSb (100 Å thick)/GaSb (100 Å thick)×80 superlattice. The laser structure comprised an $Al_{0.9}Ga_{0.1}Sb$ cladding (1.5 μm thick) and $Al_{0.3}Ga_{0.7}Sb$ waveguide (0.5 μm thick), which sandwiched the active region. The active regions comprised three 130 Å $In_{0.2}Ga_{0.8}Sb$ quantum wells separated by 200 Å $Al_{0.3}Ga_{0.7}Sb$ barriers.

The nucleation layer was formed, as above, by first forming a plurality of AlSb quantum dots on the Si substrate using MBE. The AlSb quantum dots were grown at a growth rate of 0.3 ML/sec., and using a Al:Sb ratio of about 1:10. After about 3 ML of deposition, the QD density was about $10^{11}$ QD/cm². QD height was about 1-3 nm and QD diameter was about 20 nm. Transmission electron microscopy showed the absence of defects in the nucleation layer. While not intending to be bound by any particular theory, it is believed that the defect-free epitaxy was due to a combination of high strain energy and strong atomic bonds which produced the strain-relieving crystal undulations in the AlSb grown on the Si substrate. It is believed that the periodic misfit dislocations at the Si/AlSb interface established alternating regions of strain and relations causing the undulations. The undulations increased the surface area of the epimaterial and helped to accommodate the 13% lattice mismatch. Laser emission and spectrum characterization has been reported in *Electronic Letters*, vol. 41, No. 9, 28 Apr. 2005, which is incorporated by reference herein in its entirety.

Although exemplary embodiments described herein used an Si growth substrate, the QD nucleation layer may be utilized on any mismatched lattice epitaxial layer/system including epitaxy within a structure, not necessarily on a substrate.

According to various other embodiments, a layer-by-layer planar growth mode can be accomplished without the QD layer but enabled by misfit dislocations. This growth mode does not require a nucleation layer, but can be enabled and characterized by spontaneous formation of a 2-dimensional array of 90 misfit dislocations. A subsequent bulk layer can be grown immediately on the misfit array. In this embodiment, growth conditions can enable 98% or more strain relief immediately following the misfit array formation, for example, within the first monolayer of mismatched epitaxy. Thus, the minimum nucleation layer thickness can be, for example, a single atomic layer which contains the misfit array. This bufferless growth, requiring no nucleation layer, can enable very thin devices to be formed directly on mismatched substrates to enable thin Group III-V devices on Si for example Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for forming a semiconductor device comprising:
    providing a substrate;
    forming a plurality of quantum dots on the substrate;
    forming a nucleation layer by growth and coalescence of the plurality of quantum dots, wherein the nucleation layer has a threading dislocation density of less than about $5 \times 10^5$ cm$^{-1}$; and
    forming a bulk layer on the nucleation layer, wherein a mismatch between a lattice parameter of the substrate and a lattice parameter of the bulk layer is more than about 6%.

2. The method of claim 1, wherein the substrate comprises at least one of Si and Ge.

3. The method of claim 1, wherein the step of forming a plurality of quantum dots comprises at least one of molecular beam epitaxy and chemical vapor deposition.

4. The method of claim 1, wherein the step of forming a plurality of quantum dots comprises forming a plurality of quantum dots comprising at least one element from Groups III-V.

5. The method of claim 1, wherein the step of forming a plurality of quantum dots comprises forming a plurality of quantum dots comprising at least one of AlSb quantum dots, GaAs quantum dots, and InAs quantum dots.

6. The method of claim 1, wherein the step of forming a nucleation layer by growth and coalescence of the plurality of quantum dots comprises forming a crystallographic nucleation layer having a thickness of about 3 monolayers to about 20 monolayers.

7. The method of claim 1, wherein the step of forming a bulk layer on the nucleation layer comprises forming a bulk layer comprising at least one of AlSb, GaAs, and InAs.

8. The method of claim 1, further comprising hydrogen passivating a surface of the substrate prior to the step of forming a plurality of quantum dots.

9. The method of claim 5, wherein a relaxation of the bulk layer is about 98% or more.

10. The method of claim 1, further comprising forming one or more additional layers on the bulk layer.

11. The method of claim 10, wherein the one or more additional layers comprises a GaSb layer.

12. The method of claim 11, wherein the one or more additional layers comprises a InGaSb layer on the GaSb layer.

13. The method of claim 1, wherein a quantum dot density is about $10^{11}$ QD/cm² after deposition of about 3 monolayers.

* * * * *

UNITED STATES PATENT AND TRADEMARK OFFICE
CERTIFICATE OF CORRECTION

PATENT NO.         : 7,432,175 B2                                          Page 1 of 1
APPLICATION NO. : 11/326432
DATED              : October 7, 2008
INVENTOR(S)        : Diana L. Huffaker, Larry R. Dawson and Ganesh Balakrishnan It is certified that error appears in the above-identified patent and that said Letters Patent is hereby corrected as shown below:

Column 1, lines 12 - 16, should read as follows:

This invention was developed <u>with government support</u> under Contract F49620-03-01-0433 between the University of New Mexico and the ~~AFSOR~~ <u>Air Force Office of Scientific Research</u>, and Contract MDA972-00-1-0024 between the University of New Mexico and <u>the</u> ~~DARPA~~ <u>Department of Defense/Defense Advanced Research Projects Agency</u>/Clemson. The U.S. Government ~~may have~~ <u>has</u> certain rights ~~to this~~ <u>in the</u> invention.

Signed and Sealed this

Eighteenth Day of November, 2008

JON W. DUDAS
*Director of the United States Patent and Trademark Office*